United States Patent [19]
Fournel et al.

[11] Patent Number: 5,996,099
[45] Date of Patent: Nov. 30, 1999

[54] METHOD AND APPARATUS FOR AUTOMATICALLY TESTING ELECTRONIC COMPONENTS IN PARALLEL UTILIZING DIFFERENT TIMING SIGNALS FOR EACH ELECTRONIC COMPONENT

[75] Inventors: Jean-Claude Fournel, Saint-Victor Malescours; Daniel Chausse, Saint-Etienne; Jean-Louis Murgue, Saint-Romaine-les-Atheux, all of France

[73] Assignee: Schlumberger Industries, Montrogue, France

[21] Appl. No.: 08/930,501

[22] PCT Filed: Apr. 10, 1996

[86] PCT No.: PCT/FR96/00540

§ 371 Date: Sep. 30, 1997

§ 102(e) Date: Sep. 30, 1997

[87] PCT Pub. No.: WO96/32678

PCT Pub. Date: Oct. 17, 1996

[51] Int. Cl.[6] .................................. G01R 31/28

[52] U.S. Cl. ............................. 714/724; 714/744

[58] Field of Search .................... 714/724, 736, 714/731, 744

[56] References Cited

U.S. PATENT DOCUMENTS

| 4,989,209 | 1/1991 | Littlebury et al. | 371/22.1 |
| 5,212,443 | 5/1993 | West et al. | 324/158 R |
| 5,566,186 | 10/1996 | Paterson et al. | 371/25.1 |

FOREIGN PATENT DOCUMENTS 0474275  3/1992  European Pat. Off. .

*Primary Examiner*—Hoa T. Nguyen
*Attorney, Agent, or Firm*—Frishauf, Holtz, Goodman, Langer & Chick, P.C.

[57] ABSTRACT

Apparatus for selectively testing, in parallel, identical pins of a plurality of electronic components is provided. The apparatus enables testing of selective pins of selective electronic components according to different timing schemes.

8 Claims, 5 Drawing Sheets

METHOD AND APPARATUS FOR AUTOMATICALLY TESTING ELECTRONIC COMPONENTS IN PARALLEL UTILIZING DIFFERENT TIMING SIGNALS FOR EACH ELECTRONIC COMPONENT

FIELD OF THE INVENTION

The present invention concerns a method and equipment for automatically testing electronic components in parallel.

BACKGROUND OF THE INVENTION

Most digital electronic components sold are tested by their manufacturer several times before being shipped.

Component testers have two functions: firstly, generating digital signals, at logic 0 or logic 1, for example, and, secondly, verifying the presence of output transitions by comparison with a pre-established test table. The timing and the levels of the signals generated and the signals compared are programmable. As a general rule, a component tester must generate and/or compare signals simultaneously at all the functional pins of the component under test.

Defining the signals to be generated and/or compared is usually extremely complex. Testing a microprocessor can entail strings of several million 0 or 1 bits in the same sequence. To define the signals, the concept of period is used to determine a time band within which a simpler signal is defined. This signal is decomposed into timing data, also known as a time marker, and an event, for example a transition.

A functional test is therefore executed by scanning a test programming memory in which each line corresponds to a period and the content of which represents timing and event data defining the signal within the period for each pin. The timing and event data is complemented by, among other things, an instruction which controls the scanning of the test programming memory. This instruction is common to all of the functional pins of the circuit under test. The most common instruction is that to read the next line (instruction INC).

This architecture based on scanning a memory is deterministic in the sense that it assumes that it is possible to know a priori exactly what will happen at a given time at the pins of the electronic circuit under test.

A logic component tester has various parts:

a programming system, a test circuit for each pin including a system for generating stimuli, i.e. forcing signals, which must be applied to the pin in question and a system for comparing response signals from the component, one or more interface systems, measurement heads, for adapting the stimuli to the constraints of the component to be verified.

The number of stimuli generators/comparators can be between 32 and 1 024; in the present context there is a limit of 256 generators/comparators. There can be two measurement heads, for example, each including 256 adapters.

To optimize the cost of the test and the surface area occupied by the tester, it is possible to connect identical pins of a plurality of heads to the same test circuit, i.e. to the same stimuli generation/comparison system. Multiplexers (one per signal and per pin) at the output of the generation/comparison part generally route the signals to one head or the other. Accordingly, one component is tested on head No.1 while another component is being manipulated on head No.2, and vice versa. This increases the capacity of the tester by adding one head. Typically, adding a head doubles the capacity of the tester if the test time is identical to the manipulation time.

In the case of identical components, testers with two heads used simultaneously have been proposed in which the same stimuli are generated in parallel at both heads. Likewise, the received response signals are compared with a table simultaneously by different circuits. The tester then generates two results: that from head No.1 and that from head No.2. Accordingly, the capacity of the tester is actually doubled, simply by duplicating the generation circuits and the table comparison circuits, given that the table is the same for head No.1 as for head No.2, since the signals generated and the components under test are identical.

Parallel testing therefore enables n components to be tested simultaneously in a similar way to testing a single component. The simultaneous testing can of course be done on the same head or on more than one head. The present invention is addressed to both of these alternatives.

In practice, electronic components are tested in parallel, in a manner that it is known in itself, by means of test circuits like that shown in FIG. 1 in the case of two components, each of these circuits testing identical pins on each component.

The generation system of the test circuit from FIG. 1 includes two forcing circuits adapted to apply stimuli, i.e. forcing signals, to identical pins of the components under test, said forcing signals being formed by two timing generators controlled by the programming memory, not shown in FIG. 1.

The comparison system includes two comparator circuits receiving from the pins response signals to the forcing signals, said response signals being compared to reference signals supplied by two other timing generators from a table supplied by the test programming memory.

In the remainder of this specification, the expression "test signal" is used non-specifically to refer to a forcing signal or to a response signal.

With test circuits of the type known in itself shown in FIG. 1, the pins of one component are in one-to-one correspondence with the same pins of the other component. This particular method of parallel testing, in which identical pins are forced and compared synchronously, is well-suited to components whose operation is totally known and identical from one component to another.

However, there are digital components, for example microprocessors, in which the logic state of the outputs of a given component does not correspond exactly in time to the logic state of the same outputs of another (even though identical) component. This situation is encountered in particular with components that include clocks which introduce random phase-shifts of the signals that are too large to be compensated by the limited adjustment dynamic range of the timing generators.

SUMMARY OF THE INVENTION

Accordingly, the technical problem to be solved by the present invention is that of proposing a method of automatically testing electronic components in parallel, identical pins of said components interchanging test signals with at least one common test circuit which includes, firstly, timing generators controlled by a test programming memory and, secondly, forcing circuits and comparator circuits controlled by said timing generators, which method produces for components with more complex operation test signals, i.e. forcing and/or comparison signals, which are not exactly identical from one component to another, the time marking of said signals being different.

The solution in accordance with the present invention to the technical problem as stated consists in assigning the timing generators to said forcing circuits and to said comparator circuits in such manner as to produce separate test signals for each electronic component.

Accordingly, as described in detail later, the forcing and/or comparison sequences are rendered independent for each component under test and can therefore be executed differently, allowing for the inherent characteristics of the components.

Likewise, equipment in accordance with the invention for automatically testing electronic components in parallel, comprising a plurality of test circuits respectively associated with identical pins of said components, each test circuit including, firstly, timing generators controlled by a test programming memory and, secondly, forcing circuits and comparator circuits controlled by said timing generators, is remarkable in that the forcing circuits and the comparator circuits of at least one test circuit are connected to the timing generators in such manner as to produce separate test signals for each electronic component.

BRIEF DESCRIPTION OF THE DRAWINGS

The following description with reference to the accompanying drawings, given by way of non-limiting example, shows clearly in what the invention consists and how it can be put into practice.

DETAILED DESCRIPTION OF THE PREFERRED EMBODIMENTS

Figure 2:
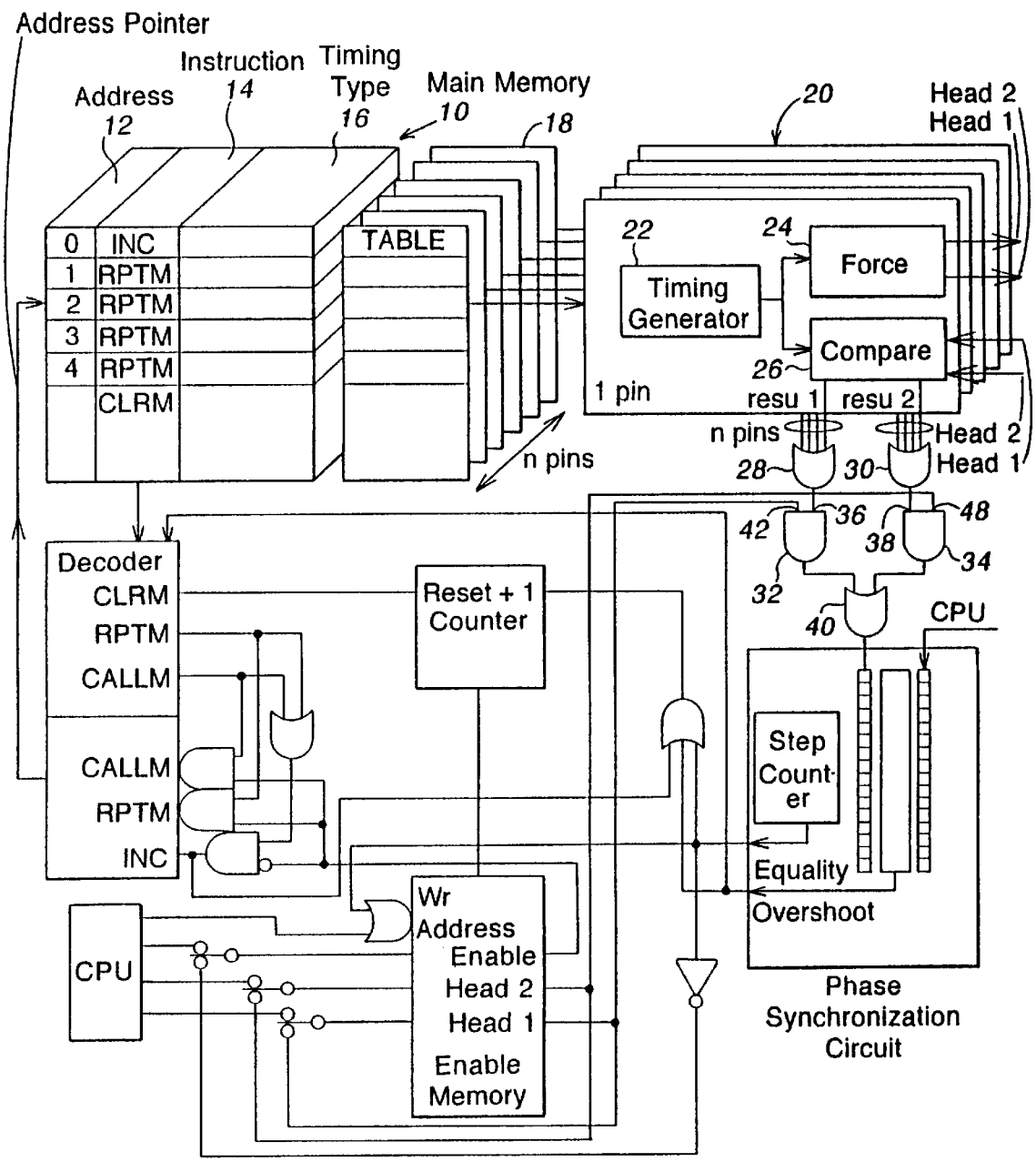
FIG. 2 is a schematic diagram of equipment for testing electronic components in parallel.

The parallel test equipment shown diagrammatically in FIG. 2 is described in detail in French Patent Application No. 94 15559; only the components essential to an understanding of the present invention will be referred to in the remainder of this description.

The test programming memory or main memory 10 contains the instructions for executing the test functional sequence.

Each address 12 of the main memory 10 defines:

an instruction 14 that is common to all of the pins under test and controls the scanning of the main memory. CALLM and RPTM are instructions calling the phase synchronization sequence. When these instructions are invoked, the phase synchronization circuit is activated and therefore controls the scanning of the main memory 10 or of subroutines. The instruction RPTM executes the same line until the phase is synchronized. The instruction CALLM executes a series of instructions until the phase is synchronized. Thus the instruction CALLM loops the memory. The instruction INC merely goes to the next line, the definition 16 of the type of timing to use during the execution of the contents of this memory address. The timing type is common to all the pins of the tester and corresponds to the address of a memory location specific to each pin in which the time value corresponding to that address is defined. This time definition architecture corresponds to the "pin sequencer" architecture that is the subject matter of U.S. Pat. No. 5,212,443, a table 18 that corresponds to the logic content (0 or 1, for example) of the signals to be sent or to be compared. This table is specific to each pin. The tester receives from the component under test response signals that it compares with data from the table 18.

The test programming main memory 10 defines the signal to be generated for each pin. A signal generation or comparison function, identical for each pin, is therefore defined which generates the stimuli (i.e. forcing signals) from data in the memory 10 and receives response signals to be compared with data from the table 18.

This is effected by means of identical test circuits 20, each circuit being assigned to one pin and comprising a set 22 of timing generators controlling in parallel, firstly, a forcing circuit 24 (event generator) sending forcing signals to components on two heads 1 and 2, for example, and, secondly, a comparator circuit 26 receiving response signals from the heads 1 and 2 and comparing these signals with the data in the table 18.

The set 22 of timing generators defines the times at which forcing signal fronts must be generated, the times at which comparison of the response signals with table 18 must commence and the times at which comparison must cease. When the comparator circuit 26 effects a comparison, it generates a result, either conformance or non-conformance with the table. This result is specific to each pin and to each component on which comparisons are effected. In FIG. 2, this result is indicated "resu 1" for head 1 and "resu 2" for head 2. It is possible to discover if the set conforms or not by applying the "or" logic operator to all of the pins by means of OR gates 28 and 30 for head 1 and head 2, respectively.

Figure 1:
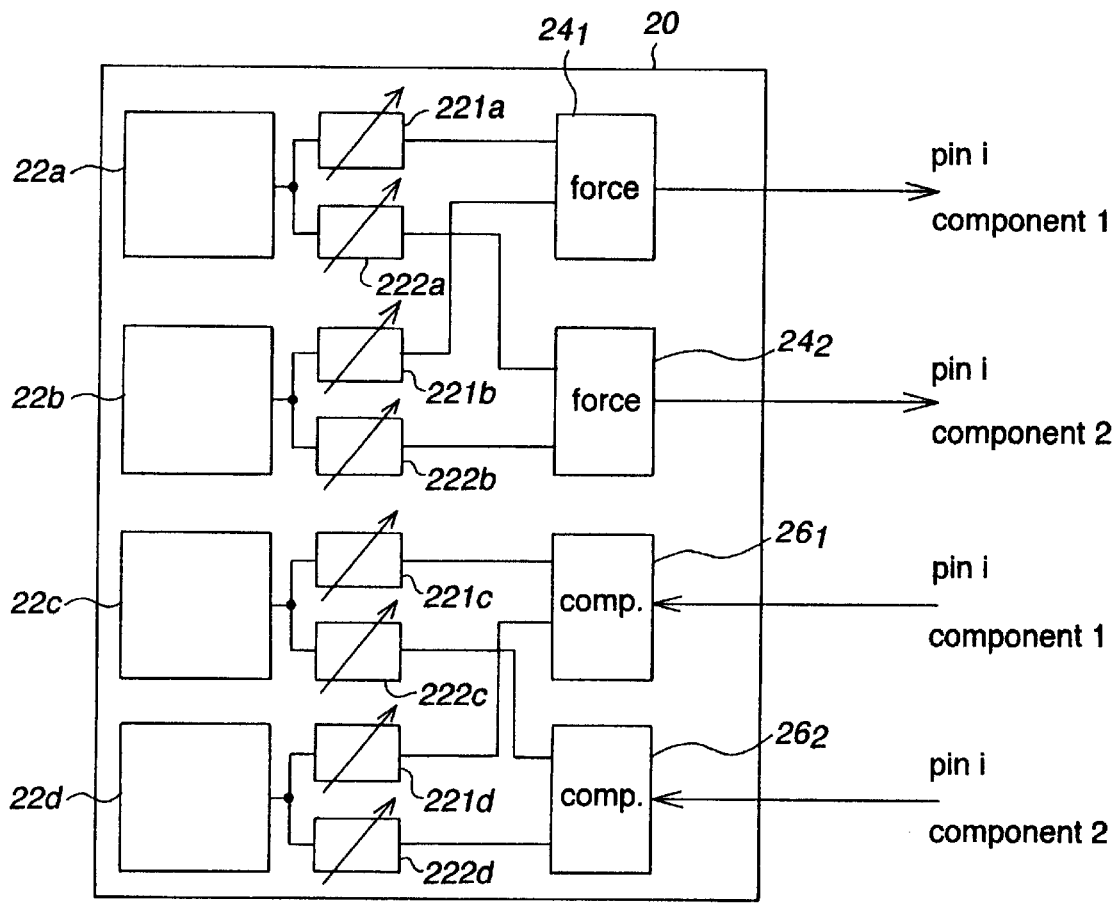
FIG. 1 is a schematic diagram of a known test circuit according to the prior art.

As shown in more detail in FIGS. 3 through 6, and in FIG. 1 (prior art), a circuit 20 for parallel testing of two components 1 and 2 includes a set of timing generators formed of four generators $22a, 22b, 22c, 22d$ adapted to control forcing circuits $24_1, 24_2$ and comparator circuits $26_1, 26_2$. Each forcing circuit $24_1, 24_2$ delivers a forcing signal to a given pin i of the components 1 and 2 under test. A respective comparator circuit $26_1, 26_2$ receives the response signal from each pin i.

Referring to FIG. 1, note also the presence of circuits 221a through 222d for adjusting the timing of the various test signals over a dynamic range of 5 ns.

In FIG. 1, the timing generators $22a, \ldots 22d$ are connected to the forcing circuits $24_1, 24_2$ and the comparator circuits $26_1, 26_2$ in such manner as to produce forcing signals and response signals that are mutually synchronous.

Figure 3:
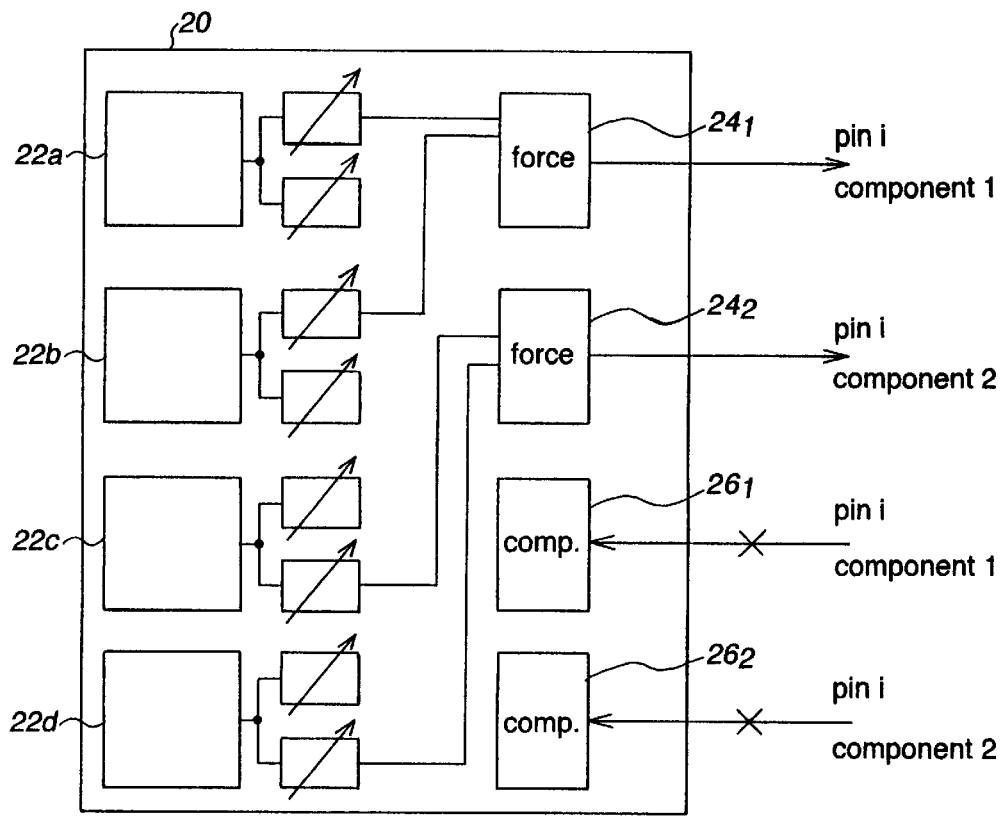
FIG. 3 is a schematic diagram of a first test circuit of parallel test equipment in accordance with the invention.
Figure 4:
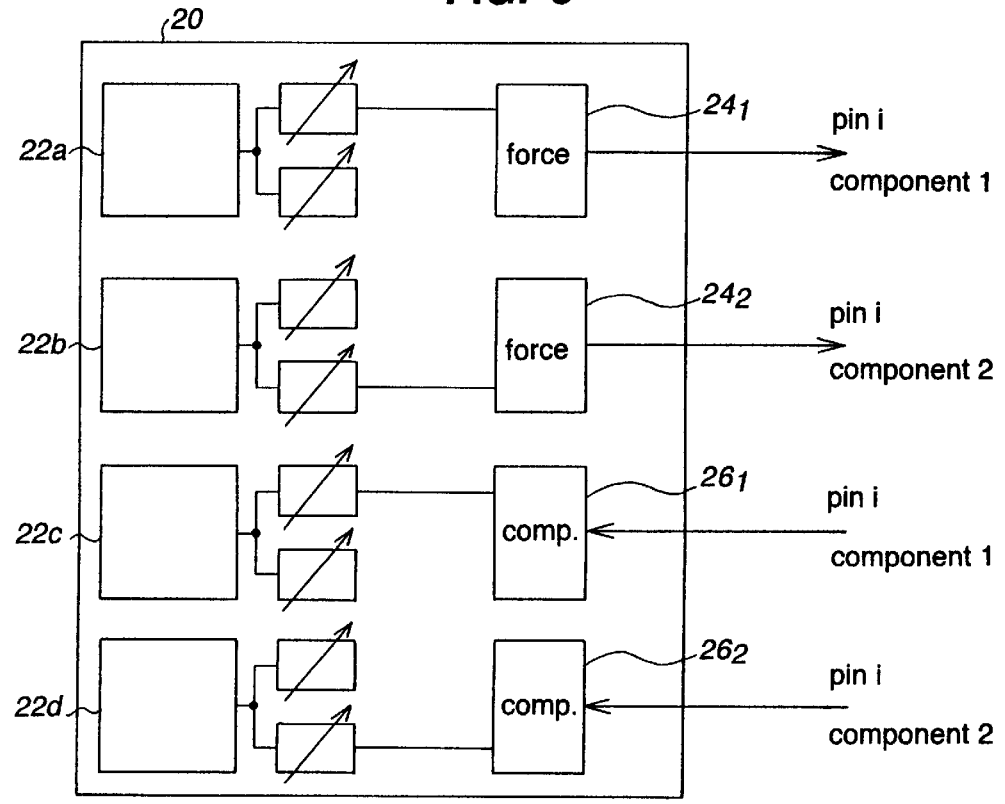
FIG. 4 is a schematic diagram of a second test circuit of parallel test equipment in accordance with the invention.

In contrast, the test circuits 20 of FIGS. 3 and 4 are designed to allow for large random phase differences, exceeding the possibilities of the adjustment circuits. To this end the various test signals, i.e. the forcing signals and/or the response signals, are rendered separate and independent by a particular assignment of the timing generators $22a, \ldots 22d$ to the forcing circuits $24_1, 24_2$ and to the comparator circuits $26_1, 26_2$.

In FIG. 3, each forcing circuit $24_1, 24_2$ of said test circuit 20 is controlled by a separate group of timing generators: $22a, 22b$ for the circuit $24_1$, and $22c, 22d$ for the circuit $24_2$.

Here all the resources of the circuit are used for forcing, so that this configuration is well suited to the situation in which no comparison is effected at the pin i in question. A forcing repetition frequency in the order of 100 MHz is obtained for time marking fronts from the generator separated by about 10 ns. The performance of the test circuit from FIG. 3 is therefore equivalent to that of the circuit known in itself shown in FIG. 1. On the other hand, for it to be possible to test the response at the pin i with independent signals, it is necessary to use the test circuit 20 from FIG. 4 in which each forcing circuit $24_1$, $24_2$ and each comparator circuit $26_1$, $26_2$ is controlled by a separate timing generator: 22a, 22b, 22c, 22d, respectively. With this type of circuit, the test window is fixed at approximately 10 ns, the time between two consecutive fronts from the timing generators.

Figure 5:
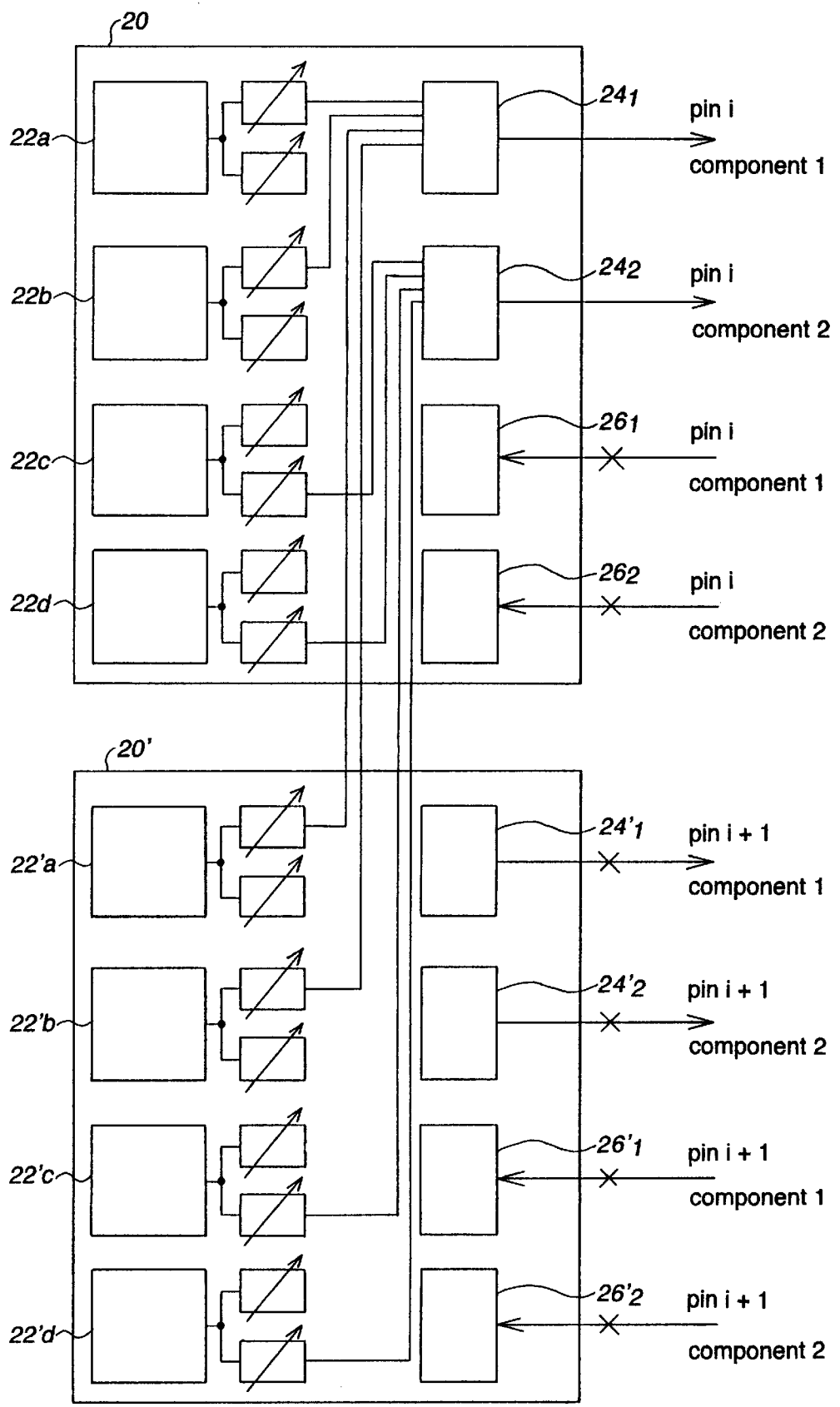
FIG. 5 is a first schematic diagram of two multiplexed test circuits of parallel test equipment in accordance with the invention.
Figure 6:
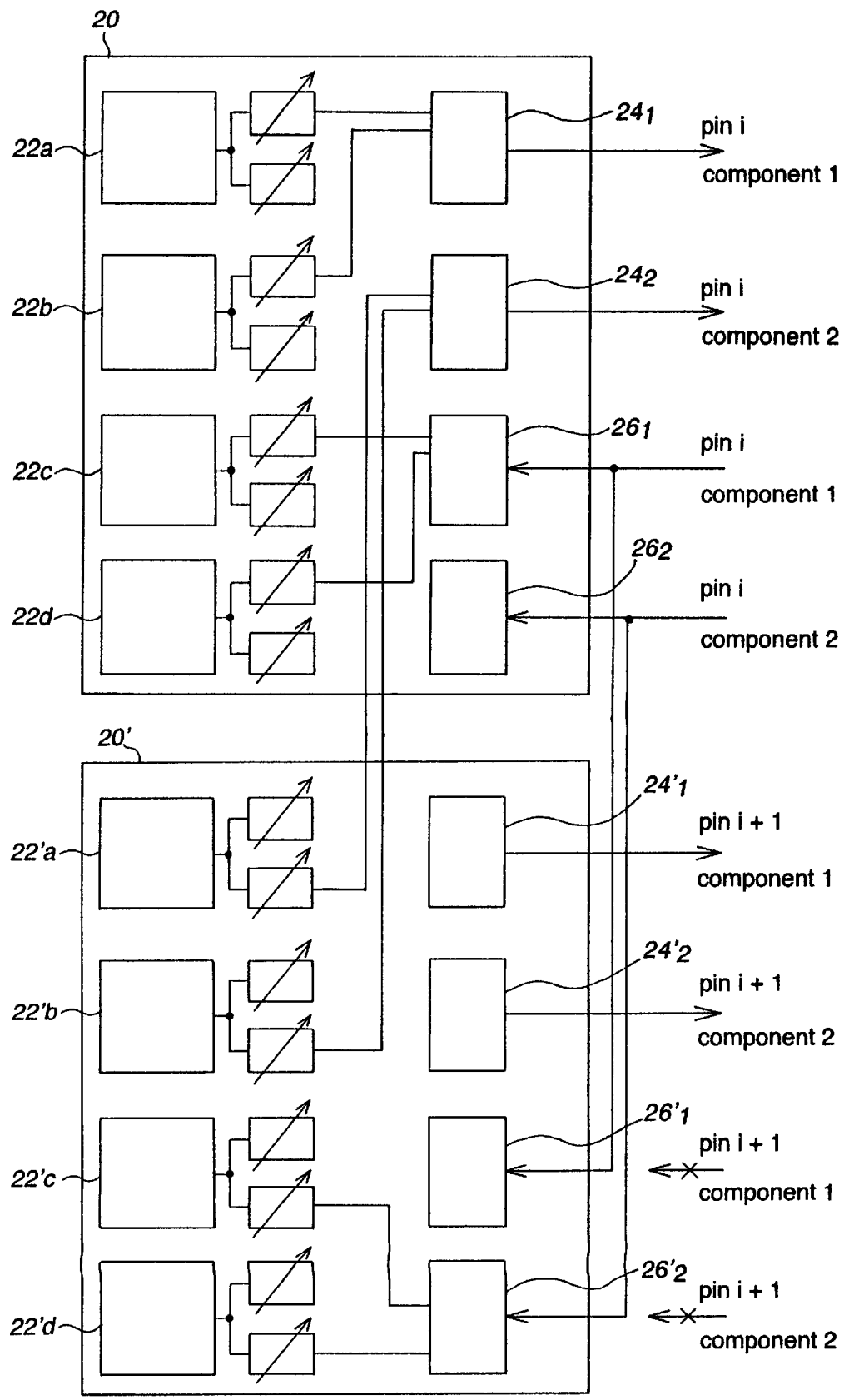
FIG. 6 is a second schematic diagram of two multiplexed test circuits of parallel test equipment in accordance with the invention.

FIGS. 5 and 6 concern an arrangement in which a circuit 20 for testing identical pins i with a certain parity is multiplexed with a circuit 20' for testing identical pins i+1 with the opposite polarity.

In FIG. 5, each forcing circuit $24_1$, $24_2$ of the test circuit 20 associated with the pin i, for example, is controlled by a separate group of timing generators of the multiplexed circuits 20, 20': namely 22a, 22b, 22'a, 22'b, on the one hand, and 22c, 22d, 22'c, 22'd, on the other hand. The FIG. 5 arrangement provides the same functions as that of FIG. 3, i.e. generation of forcing signals at the pins i of the components. Note that the repetition frequency is doubled, however, from 100 MHz to 200 MHz.

The configuration of FIG. 6 is such that each forcing circuit $24_1$, $24_2$ of the test circuit 20 associated with a pin i with a given parity, a comparator circuit $26_1$, of the test circuit associated with the pin i for a component 1 and a comparator circuit $26_2$ of the test circuit 20' associated with the pin i+1 with the opposite polarity for another component 2 are controlled by a separate group of generators of the two multiplexed test circuits 20, 20': respectively 22a and 22b, 22'a and 22'b, 22c and 22d, 22'c and 22'd. Once again, the functions are the same as for the FIG. 4 test circuit, but with enhanced performance: variable test window and 100 MHz repetition frequency, as for FIGS. 1 and 3.

We claim:

1. A method for automatically testing, in parallel, with at least one common test circuit, a plurality of respective electronic components having identical pins (i), the at least one common test circuit including a plurality of timing generators (22a, 22b, 22c, 22d; 22'a, 22'b, 22'c, 22'd) controlled by a test programming memory (10), and forcing circuits ($24_1$, $24_2$; $24'_1$, $24'_2$) and comparator circuits ($26_1$, $26_2$; $26'_1$, $26'_2$) controlled by said timing generators, the method comprising the steps of:

interchanging test signals between the identical pins of the electronic components and the at least one common test circuit (20; 20'); and coupling the timing generators (22a, 22b, 22c, 22d) respectively to the forcing circuits and to the comparator circuits so as to produce separate test signals at independent times for the identical pins of the electronic components.

2. Apparatus for automatically testing, in parallel, with a test programming memory, a plurality of electronic components having a plurality of respective identical pins, comprising:

a plurality of test circuits (20;20') respectively associated with the plurality of identical pins (i; i+1), each of the plurality of test circuits (20; 20') including timing generators (22a, 22b, 22c, 22d; 22'a, 22'b, 22'c, 22'd) controlled by the test programming memory (10), and forcing circuits ($24_1$, $24_2$; $24'_1$, $24'_2$) and comparator circuits ($26_1$, $26_2$; $26'_1$, $26'_2$) coupled to and controlled by said timing generators, wherein said forcing circuits and said comparator circuits of at least one test circuit are connected to the timing generators which include timing means to produce separate test signals for each of said plurality of electronic components.

3. Apparatus according to claim 2 wherein each said forcing circuit ($24_1$, $24_2$) of said test circuit (20) is controlled by different ones from among said timing generators (22a, 22b, 22c, 22d).

4. Apparatus according to claim 2 wherein each forcing circuit ($24_1$, $24_2$) and each comparator circuit ($26_1$, $26_2$) of said test circuit is controlled by a different one from among said timing generators.

5. Apparatus according to claim 2 having a first test circuit (20), from among the plurality of test circuits (20, 20'), which tests a first plurality of identical pins (i) with a certain parity and is multiplexed with a second test circuit (20'), from among the plurality of test circuits (20, 20'), which tests a second plurality of identical pins (i+i) with an opposite parity, wherein each forcing circuit ($24_1$, $24_2$) of the first test circuit (20) associated with the first plurality of identical pins (i) is controlled by different ones from among said timing generators (22a, 22b, 22c, 22d; 22'a, 22'b, 22'c, 22'd) of the first and second test circuits (20, 20').

6. Apparatus according to claim 2, having a first test circuit (20), from among the plurality of test circuits (20, 20'), which tests a first plurality of identical pins (i) with a certain parity and is multiplexed with a second test circuit (20'), from among the plurality of test circuits (20, 20'), which tests a second plurality of identical pins (i+1) with an opposite parity, wherein each forcing circuit ($24_1$, $24_2$) of the first test circuit (20) associated with the first plurality of pins (i), a comparator circuit ($26_1$) of the first test circuit (20) associated with said first plurality of identical pins (i) and a comparator circuit ($26_2$) associated with the second plurality of identical pins (i+1) are controlled by different ones from among said timing generators (22a, 22b, 22c, 22d; 22'a, 22'b, 22'c, 22'd) of the first and second test circuits (20, 20').

7. A method for automatically testing, in parallel, with a test circuit, first and second electronic components having identical pins, the test circuit having forcing circuits and comparator circuits which are responsive to timing signals generated by first and second timing generators, the method comprising the steps of:

generating a first timing signal with the first timing generator;

generating a second timing signal with the second timing generator;

responsive to the first timing signal, providing a test signal to a first pin of the first electronic component; and responsive to the second timing signal, providing the test signal to a first pin of the second electronic component.

8. The method as defined by claim 7 further comprising the steps of:

responsive to the first timing signal, comparing an output signal of the first electronic component with a known value; and responsive to the second timing signal, comparing an output signal of the second electronic component with the known value.

* * * * *

UNITED STATES PATENT AND TRADEMARK OFFICE
CERTIFICATE OF CORRECTION

PATENT NO. : 5,996,099
DATED : November 30, 1999
INVENTOR(S) : Jean-Claude Fournel It is certified that error appears in the above-identified patent and that said Letters Patent is hereby corrected as shown below:

<u>Title page,</u>
Insert -- [30]   Foreign Application Priority Data
April 11, 1995  [FR]    France……………………. 95/04440 --

Signed and Sealed this

Eighth Day of April, 2003

JAMES E. ROGAN
*Director of the United States Patent and Trademark Office*